United States Patent [19]

Wilson et al.

[11] Patent Number: 4,888,549

[45] Date of Patent: Dec. 19, 1989

[54] SYSTEM FOR TESTING INDIVIDUALLY A PLURALITY OF DISK DRIVE UNITS

[75] Inventors: Randall R. Wilson, Santa Ana; James E. Dietz, Yorba Linda, both of Calif.

[73] Assignee: Wilson Laboratories, Inc., Orange, Calif.

[21] Appl. No.: 115,164

[22] Filed: Oct. 30, 1987

[51] Int. Cl.4 .............. G01R 15/12; G01K 31/28; H05K 7/14; G11B 27/36

[52] U.S. Cl. .............. 324/73 R; 324/158 F; 361/415; 360/31

[58] Field of Search .......... 324/73 R, 73 PC, 73 AT, 324/158 R, 158 F; 361/391, 415, 428; 360/31

[56] References Cited

U.S. PATENT DOCUMENTS

| 4,683,424 | 7/1987 | Cutright et al. | 324/158 F |
|---|---|---|---|
| 4,695,707 | 9/1987 | Young | 324/73 PC |
| 4,725,968 | 2/1988 | Baldwin et al. | 360/31 |

Primary Examiner—Gerard R. Strecker
Assistant Examiner—Walter E. Snow
Attorney, Agent, or Firm—Lyon & Lyon

[57] ABSTRACT

A tester for storage peripheral devices, such as Winchester disk drives, is provided. The tester comprises a test module which contains one or more ports. The storage peripheral device under test is placed into a carrier which is in turn inserted into the port. The carrier preferably includes a base comprised of a printed circuit board, a front panel, a frame and electronics and electronic connectors. The unit under test is connected to the base via the electronic connectors. The carrier is inserted into mating engagement with the test module. Environmental control is achieved by varying the amount of air flow through the test ports. Historical memory is provided on board the carrier to monitor carrier use. Optional magnetic latch means are provided on the carrier to indicate test status of the device under test.

6 Claims, 3 Drawing Sheets

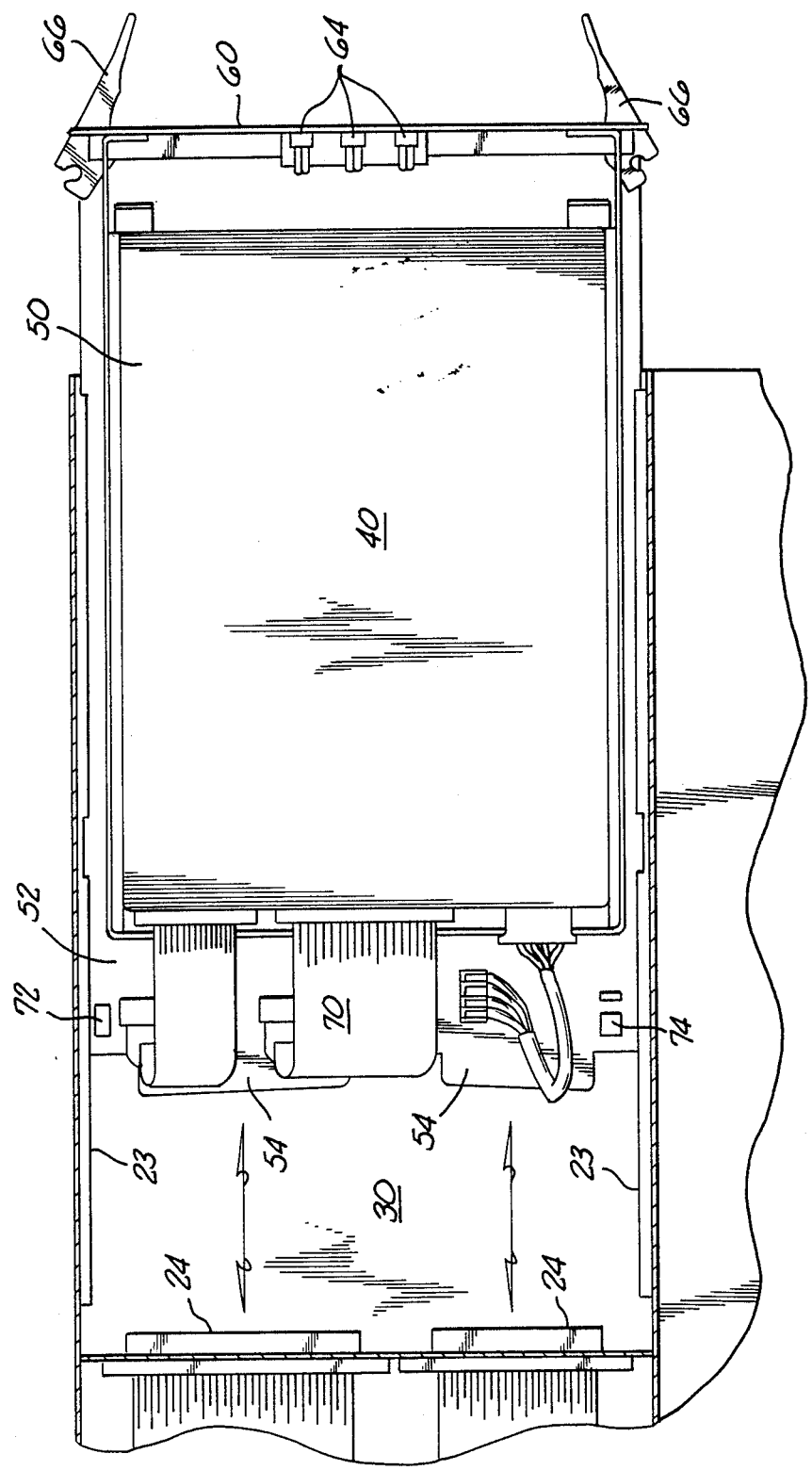

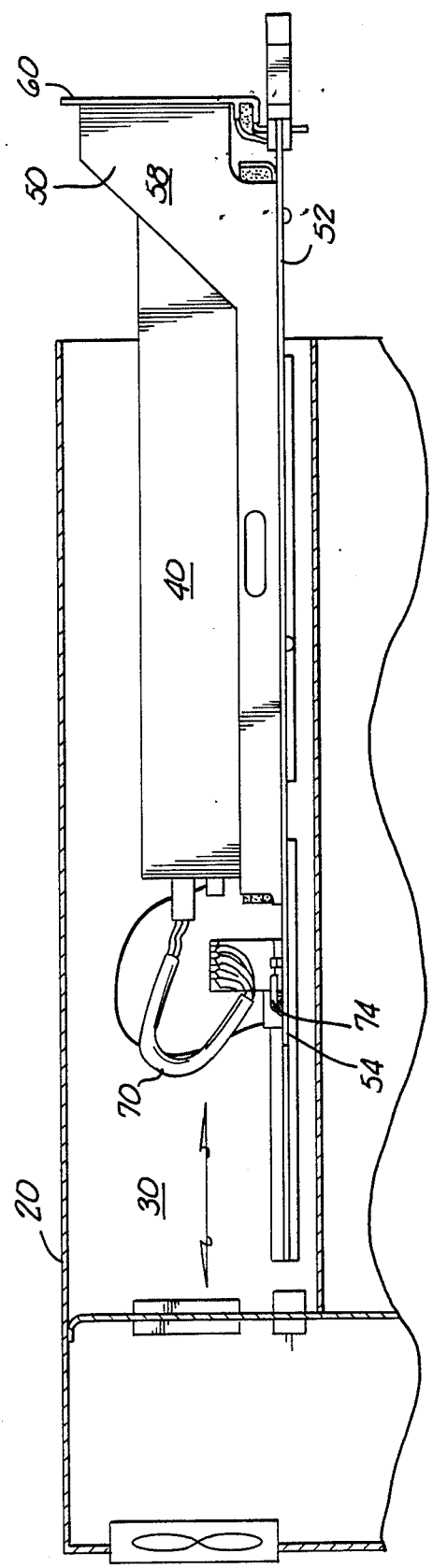

SYSTEM FOR TESTING INDIVIDUALLY A PLURALITY OF DISK DRIVE UNITS

FIELD OF THE INVENTION

This invention relates to testers for electronic devices and is particular directed to testers for storage peripheral devices, such as Winchester disk drives.

BACKGROUND

In the manufacture and use of storage peripheral devices it is necessary to test the devices. Manufacturers and large users of storage peripheral devices often test large numbers of devices simultaneously. Test equipment and techniques exist for testing large numbers of devices in parallel. Currently, each device to be tested is connected via a cable or cables to the test electronics. The devices are set on tables, shelves or racks.

This arrangement results in a potentially large number of loose connection cables between the test electronics and the devices under test. Confusion can arise because of the potentially large number of connection cables. This arrangement results in an inefficient use of the test electronics. For example, test time is lost during device connection and disconnection periods. Further, it is difficult to determine the status of the device during test as no status indicators exist. Similarly, the status of the device is not apparent after it has been removed from the test electronics. Connection and disconnection of cables to the Storage Peripheral Devices can cause mechanical shock, potentially resulting in damage to the device.

In the current arrangement, the storage peripheral devices are generally exposed to the ambient environment. The devices may be subjected to mechanical shock. Further, since the devices are exposed to the ambient environment it is very difficult to control the environment of the device under test. A particularly important parameter is temperature. It is sometimes desirable to test a device at an elevated temperature which approximates the device's operating environment when enclosed within a computer or larger electronic device. In order to achieve elevated temperatures the current practice is to place an insulating box, such as a plastic box, over the device under test.

SUMMARY OF THE INVENTION

A tester for storage peripheral devices comprises one or more carriers which mates with a test module. Each carrier holds or cradles a storage peripheral device under test. The carrier is comprised of a base, preferably a printed circuit board, a frame, a front panel and electronics and electronic connectors. The device under test sits atop the carrier, on a shock absorbing surface. The test module comprises one or more ports for receiving the carriers. Test electronics may also be included within the test module. A Storage Peripheral Device to be tested is placed in the carrier which has been removed from the port. Electronic connections are easily made via connection cables attached to the carrier. The carrier and device are inserted into the port. Edge connectors on the carrier mate with connector receptacles on the test module. The carrier is securely mated to the test module by use of ejectors mounted on the carrier. The device is thus protected from mechanical disturbance. While the device is under test, status lights on the front panel provide current status information.

The environment to which the storage peripheral device under test is exposed may be modified. Air flow through the test port may be controlled via a fan and adjustable baffle. The temperature of the device may be controlled in this manner.

Each carrier may optionally be provided with an electronic memory, such as an electrically erasable programmable read only memory (EEPROM), which retains information on usage of the carrier. For example, the total number of prior tests or insertions and removals of the carrier may be monitored. Additionally, a latched indicator may be included in the carrier to indicate the device test status after removal of the carrier from the test module.

Thus, it is a principal object of this invention to provide a tester for storage peripheral devices in which one or more device may be tested.

It is a further object of this invention to provide a tester in which the environment may be controlled.

It is an object of this invention to provide a tester which reduces or eliminates the mechanical shock to storage peripheral devices under test when connected to the test electronics.

It is a further object of this invention to provide a carrier which is itself capable of remembering information regarding its prior use.

These and other objects and advantages of the present invention will become more clear upon reference to the accompanying drawings and the following detailed description.

BRIEF DESCRIPTION OF THE DRAWINGS

FIG. 2 is a top view of a carrier partially inserted into a test module, and FIG. 3 is a side view of a carrier partially inserted into a test module.

DETAILED DESCRIPTION

Figure 1:
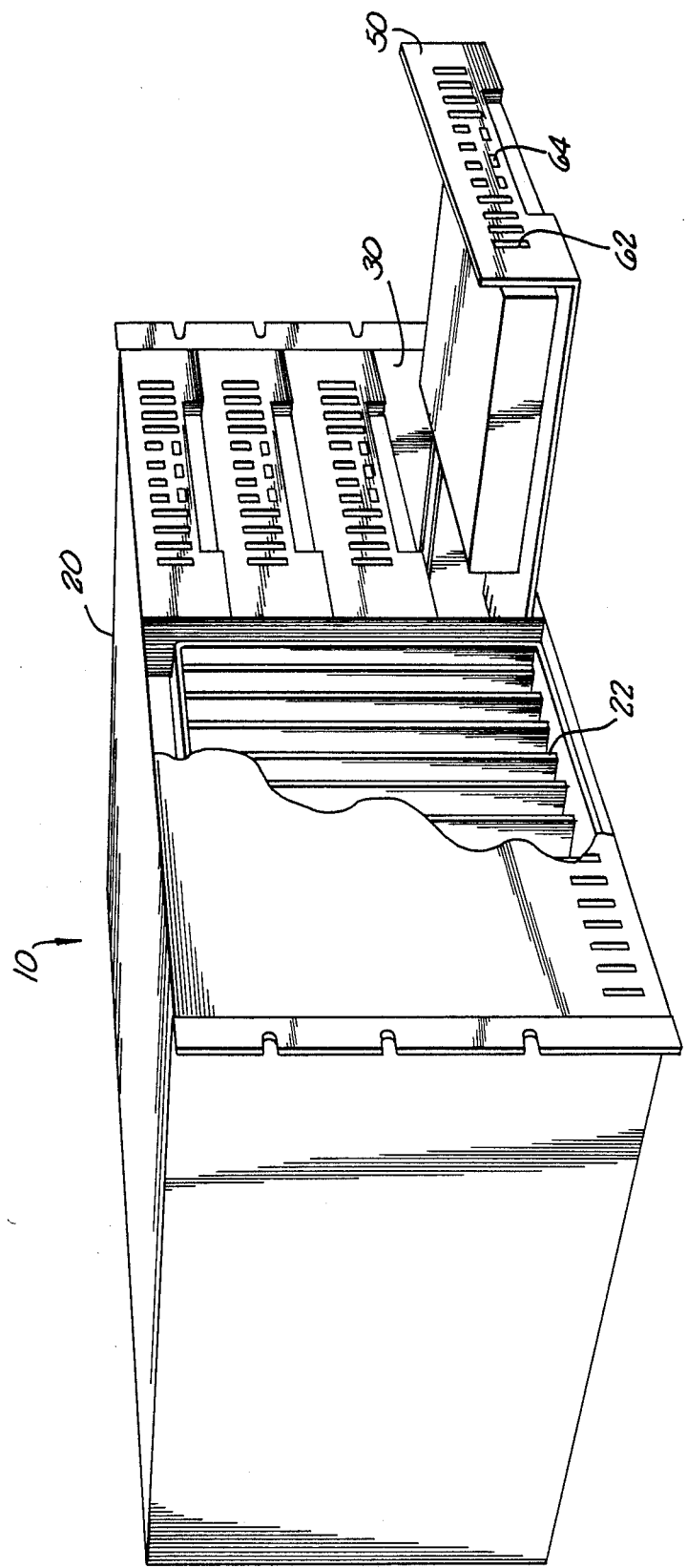
FIG. 1 is a perspective view of the overall tester including the test module and carriers.

FIG. 1 shows a typical configuration of the tester 10. A test module 20 is provided with one or more test ports 30 into which carriers 50 are inserted. The tester 10 is shown with four ports 30 and four carriers 50. The test module 20 may contain electronics on, for example, printed circuit boards 22.

While the tester 10 contains four ports 30 and associated carriers 50, the number is variable. Additionally, one or more testers 10 may be used simultaneously under control of a computer, not shown. The testers 10 may be stacked or mounted in racks.

Top and side views of a carrier 50 partially inserted into a test module 20 are shown in FIG. 2 and FIG. 3 respectively. The carrier 50 is comprised generally of a base 52, preferably a printed circuit board, a support Frame 58, a front panel 60, electronics, and electronic connectors 70.

The base 52 is preferable on epoxy glass printed circuit board. The base 52 provides edge connectors 54 for connection to the test module 20. The edge connectors 54 are interconnected to one or more removable connection cables 70, preferably flat cable. The connection cables 70 are preferably detachable from the base 52 for ease of replacement in the event of damage or failure.

The frame 58 provides mechanical rigidity for the carrier 50. Additionally, the frame 58 may provide lateral support for the storage peripheral devices under test 40. The frame 58 may be constructed from any suitable material, preferably sheet aluminum.

The front panel 60 is typically connected to the frame 58. The front panel 60 preferably contains a plurality of ventilation holes 62. Status lights 64 are affixed to the front panel 60 to indicate the current status of the storage peripheral device under test 40. Such indicator lights 64 preferably include "PASS", "TEST", and "FAIL".

The test module 20 contains one or more ports 30 into which the carriers 50 are inserted. Connector receptacles 24 provide for mating engagement to the edge connectors 54. Edge guides 22 are engaged with the base 52, guiding the carrier 50 into engagement with the test module 20.

Once the carrier 50 is inserted into close proximity with the connector receptacles 24, ejectors 66 are engaged with the test module 20. This pulls the carrier 50 into complete mating engagement with the test module 20. Insertion and ejection can be accomplished with minimal mechanical disturbance to the Storage Peripheral Device under test 40.

Heat is generated by the storage peripheral devices 40 while under test. Air flow through the test port 30 may be achieved by use of a fan in the test module 20. Control of the air flow may be achieved preferably by use of adjustable baffles at the rear of the test port 30 shown in FIG. 3 at the back end of the test port 30. The temperature of the unit under test 40 may be controlled by adjusting the air flow.

An historical memory 74 may be provided. Preferably the memory is an EEPROM. The memory 74 may store information to be monitored by the test electronics. This information may include such things as number of carrier insertions and carrier identification information.

The carrier is optionally provided with a latch indicator 72 which indicates the test status of the Storage Peripheral Device under test 40, when the carrier 50 is removed from the test module 20. The latch indicator 72 is preferably a magnetic latch which will indicate status by the use of either of two selected colors.

Though this invention has been described with respect to specific preferred embodiments thereof, many variations and modifications will become apparent to those skilled in the art. It is therefore the intention that the appended claims be interpreted as broadly as possible in view of the prior act to include all such variations and modifications.

What is claimed is:

1. A system for testing a plurality of storage peripheral devices comprising;
    a test module containing a plurality of ports,
    a plurality of carrier means for holding one or more storage peripheral devices, the carrier means being further adapted to mate with the ports, each carrier containing a status indicator which indicates the status of the storage peripheral device even when the carrier is removed from the test module, and
    an electrical connection between the test module and each carrier.

2. The system of claim 1 wherein the status indicator is a magnetic latch.

3. A tester for disk drives comprising:
    a test module containing a plurality of ports,
    carrier means for receiving a disk drive and mating with the ports, a receptacle on the test module for providing mating engagement to the carriers, a connector on the carrier adapted to be received by the receptacle of the test module, means to lock the carrier into mating engagement with the test module, and an historical memory for recording prior usage of the individual carriers.

4. A system for testing the plurality of storage peripheral devices comprising:
    a test module containing a plurality of ports,
    a plurality of carrier means for holding one or more storage peripheral devices, the carrier means being further adapted to mate with the ports,
    independent electrical connection between the test module and each carrier means, and
    a status indicator on the carrier which indicates the status of the storage peripheral device even when the carrier is removed from the test module.

5. The system of claim 4 wherein the status indicator is a magnetic latch.

6. A tester for disk drives comprising:
    a test module containing a plurality of ports,
    carrier means for receiving a disk drive and to mate with the ports,
    a receptacle on the test module for providing mating engagement to the carriers,
    a connector on the carrier adapted to be received by the receptacle of the test module,
    means to lock the carrier into mating engagement with the test module, and
    a historical memory for recording prior usage of the individual carriers.

* * * * *